United States Patent
Sharma

(10) Patent No.: US 10,437,344 B2
(45) Date of Patent: Oct. 8, 2019

(54) PROXIMITY ACTIVATED GESTURE

(71) Applicant: Microchip Technology Incorporated, Chandler, AZ (US)

(72) Inventor: Attma Sharma, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 223 days.

(21) Appl. No.: 15/411,571

(22) Filed: Jan. 20, 2017

(65) Prior Publication Data

US 2017/0212599 A1  Jul. 27, 2017

Related U.S. Application Data

(60) Provisional application No. 62/281,587, filed on Jan. 21, 2016.

(51) Int. Cl.
*G06F 3/01* (2006.01)
*G06F 3/044* (2006.01)
*G06F 3/0488* (2013.01)
*H03K 17/955* (2006.01)

(52) U.S. Cl.
CPC .............. *G06F 3/017* (2013.01); *G06F 3/044* (2013.01); *G06F 3/04886* (2013.01); *H03K 17/955* (2013.01); *G06F 2203/04101* (2013.01); *G06F 2203/04108* (2013.01); *G06F 2203/04111* (2013.01)

(58) Field of Classification Search
CPC ..................................................... G06F 3/044
See application file for complete search history.

(56) References Cited

U.S. PATENT DOCUMENTS

| 4,550,221 A * | 10/1985 | Mabusth | G06F 3/03547 178/18.06 |
|---|---|---|---|
| 6,239,788 B1 * | 5/2001 | Nohno | G06F 3/0412 178/18.03 |
| 9,110,543 B1 * | 8/2015 | Dabell | G06F 3/044 |
| 2013/0293489 A1 * | 11/2013 | Shin | G06F 3/041 345/173 |
| 2014/0002406 A1 | 1/2014 | Cormier, Jr. et al. | 345/174 |
| 2015/0169218 A1 * | 6/2015 | Cromer | G06F 3/04886 715/773 |
| 2015/0261285 A1 * | 9/2015 | Wilson | G06F 3/044 345/173 |

FOREIGN PATENT DOCUMENTS

WO  2016/005538 A1  1/1916  ............. G06F 3/041

OTHER PUBLICATIONS

International Search Report and Written Opinion, Application No. PCT/US2017/014492, 10 pages, dated Apr. 7, 2017.

* cited by examiner

*Primary Examiner* — Chad M Dicke
(74) *Attorney, Agent, or Firm* — Slayden Grubert Beard PLLC

(57) ABSTRACT

A proximity-activated gesture circuit includes an activation receiver electrode, a transmitter electrode, additional receiver electrodes, a control circuit, and a signal processor circuit. The control circuit is configured to activate the transmitter electrode and additional receiver electrodes when a capacitance measurement by the activation receiver electrode reaches a threshold. The signal processor circuit is configured to interpret measurements from the additional receiver electrodes as a gesture.

26 Claims, 10 Drawing Sheets

PROXIMITY ACTIVATED GESTURE

RELATED PATENT APPLICATION

This application claims priority to commonly owned U.S. Provisional Patent Application No. 62/281,587; filed Jan. 21, 2016; which is hereby incorporated by reference herein for all purposes.

TECHNICAL FIELD

The present disclosure relates to proximity and touch sensing and, more particularly, to a method and system for sensing impedance change in the local space between electrodes.

BACKGROUND

A wide variety of touch, proximity, and gesture detection devices are available today. For example, touch, cap-touch, GestIC® 2D and GestIC® 3D technology is available from the assignee of the present application. These function on the principle of Capacitive Voltage Division (CVD) or charge time measurement technique. There has also been a history of development with RC oscillators.

SUMMARY

Figure 1:
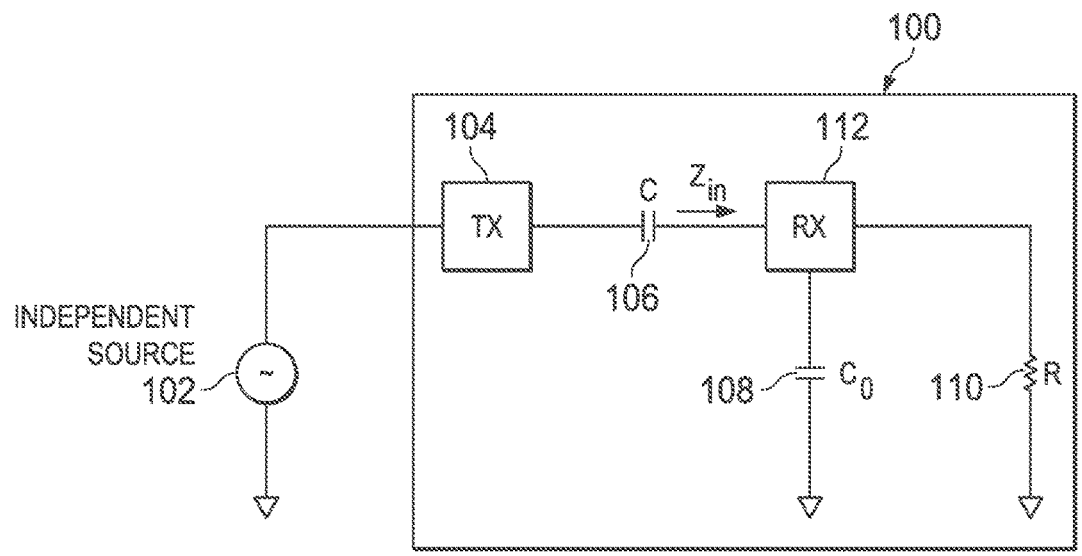
FIG. 1 illustrates an example of a simplified model for detecting changes in capacitance, according to embodiments of the present disclosure.

Embodiments of the present disclosure include a receiver stage, comprising a receiver electrode and a loop filter. The loop filter may be configured to issue a capacitance measurement upon activation of electrical oscillation. In combination with any of the above embodiments, the capacitance measurement including capacitance with respect to an inactive transmitter electrode and an activation receiver electrode. In combination with any of the above embodiments, the loop filter is further configured to activate the receiver stage through the electrical oscillation. In combination with any of the above embodiments, the loop filter is further configured to activate the receiver stage through the electrical oscillation when the capacitance measurement reaches a threshold. In combination with any of the above embodiments, the loop filter is further configured to activate an inactive receiver circuit when the capacitance measurement reaches a threshold. In combination with any of the above embodiments, the loop filter is further configured to activate the receiver stage when the capacitance measurement drops to the threshold, indicating a proximity or a touch by an object. In combination with any of the above embodiments, the loop filter is further configured to activate the receiver stage when the capacitance measurement rises to the threshold, indicating a proximity or a touch by an object. In combination with any of the above embodiments, the loop filter is further configured to activate the receiver stage when a loop gain of a feedback control loop connecting the receiver stage is approximately one. In combination with any of the above embodiments, the loop filter is further configured to postpone issuance of the capacitance measurement when a gain of a feedback control loop connecting the receiver stage is less than one.

Embodiments of the present disclosure may include sensor systems including any of the above receiver stages.

Embodiments of the present disclosure may include a sensor system, comprising a receiver circuit including a receiver electrode, a transmitter circuit including a transmitter electrode, and a control circuit including a loop filter. The sensor system may be implemented in combination with any of the above embodiments of receiver circuits. In combination with any of the above embodiments, the receiver circuit is configured to oscillate when a capacitance measurement reaches a threshold. In combination with any of the above embodiments, the capacitance measurement includes capacitance between the receiver electrode and the transmitter electrode. In combination with any of the above embodiments, the capacitance measurement is performed while the transmitter electrode is deactivated. In combination with any of the above embodiments, the control circuit is configured to activate the transmitter circuit when the receiver circuit oscillates. In combination with any of the above embodiments, the transmitter electrode is deactivated when the transmitter electrode is not oscillating. In combination with any of the above embodiments, the control circuit is configured to activate the transmitter nearly simultaneously through oscillation. In combination with any of the above embodiments, the control circuit is further configured to activate the transmitter circuit when the capacitance measurement falls to the threshold, indicating a proximity or a touch by an object with respect to the receiver electrode. In combination with any of the above embodiments, the control circuit is further configured to activate the transmitter circuit when the capacitance measurement rises to the threshold, indicating a proximity or a touch by an object with respect to the receiver electrode. In combination with any of the above embodiments, the control circuit is further configured to activate the transmitter circuit when a loop gain of a feedback loop connecting the receiver circuit is approximately one. In combination with any of the above embodiments, the control circuit is further configured to postpone activation of the transmitter circuit when a loop gain of a feedback loop connecting the receiver circuit is less than one. In combination with any of the above embodiments, the feedback loop may include the receiver circuit and a transmitter circuit that are to oscillate nearly simultaneously during active operation.

Embodiments of the present disclosure include a system, comprising an electrode arrangement for spatial detection of an objection in an observation area. The electrode arrangement may comprise a transmitting electrode in close proximity to a first receiving electrode and at least one further receiving electrode spaced apart from the transmitting electrode. In combination with any of the above embodiments, the system may include a receiver circuit configured to detect a touch or close proximity of the first receiving electrode and, as a result, activate a loop filter. In combination with any of the above embodiments, the loop filter is configured to activate the transmitting electrode and the at least one further receiving electrode in a feedback loop. In combination with any of the above embodiments, the loop filter comprises at least one controllable impedance configured to be coupled between the at least one further receiving electrode and the transmitting electrode, a sensor circuit coupled with the at least one further receiving electrode and the transmitting electrode, wherein the sensor core is configured to receive a signal from the at least one further receiving electrode and generate a driving signal from the received signal fed to the transmitting electrode, a signal processor coupled with the at least one further receiving electrode and the transmitting electrode, and a startup and timing circuit configured to vary the controllable impedances to a specified state to satisfy sustained self-oscillation. In combination with any of the above embodiments, the system includes a plurality of further receiving electrodes and a multiplexer configured to couple one of the plurality of further receiving electrodes with the controllable impedance to close the feedback loop. In combination with any of the above embodiments, the system includes a plurality of further receiving electrodes, wherein signals from the plurality of further receiving electrodes are fed through transfer function circuits Hn, respectively, and summed, wherein a summed signal is fed as a driving signal to the transmitting electrode. In combination with any of the above embodiments, the system is configured to operate in one of three operating modes, wherein a first operating mode provides for a self-sustained oscillation, a second operating mode is a saturation mode in which the oscillation is driven into saturation, and a third operating mode is a decaying burst mode wherein by feeding the feedback loop with pulses from a startup and timing circuit, a transient burst of a decaying sinusoid is generated. In combination with any of the above embodiments, in all three operating modes, the system is configured to perform relative amplitude and phase measurements to determine multidimensional information about impedance changes in a sensing space.

In combination with any of the above embodiments, activation of an element may be performed by oscillating a circuit component. In combination with any of the above embodiments, activation of an element may be performed in parallel with other elements connected in a feedback loop. In combination with any of the above embodiments, an element may be deactivated wherein it is not oscillating, though it is still powered.

Embodiments of the present disclosure include a proximity-activated gesture circuit. The circuit may include a first activation receiver electrode, a first transmitter electrode, a plurality of second receiver electrodes, a control circuit, and a signal processor circuit. In combination with any of the above embodiments, the control circuit may be configured to activate the first transmitter electrode and the plurality of receiver electrodes when a capacitance measurement by the first activation receiver electrode reaches a threshold. In combination with any of the above embodiments, the signal processor circuit may be configured to interpret measurements from the second receiver electrodes as a gesture. In combination with any of the above embodiments, the capacitance measurement includes a capacitance between the first activation receiver electrode and the first transmitter electrode when the first transmitter electrode is inactive. In combination with any of the above embodiments, the gesture circuit further includes a second activation receiver electrode. In combination with any of the above embodiments, the control circuit is further configured to activate the first transmitter electrode and the plurality of receiver electrodes when the capacitance measurement by the first activation receiver electrode reaches a threshold or when a capacitance measurement by the second activation receiver electrode reaches another threshold. In combination with any of the above embodiments, the gesture circuit includes a second activation receiver electrode. In combination with any of the above embodiments, the control circuit is further configured to activate the first transmitter electrode and the plurality of receiver electrodes when both the capacitance measurement by the first activation receiver electrode reaches a threshold and a capacitance measurement by the second activation receiver electrode reaches another threshold. In combination with any of the above embodiments, the first activation receiver is placed at one edge of a space for detection, and the second activation receiver is placed at an opposite edge of the space for detection. In combination with any of the above embodiments, the first activation receiver and the second activation receiver are placed at edges of a space representing a space bar of a virtual keyboard. In combination with any of the above embodiments, the plurality of second receiver electrodes are arranged to detect gestures in a virtual keyboard. In combination with any of the above embodiments, the plurality of second receiver electrodes are arranged in a linear manner to capture a multi-dimensional movement. In combination with any of the above embodiments, the plurality of second receiver electrodes are arranged in a linear manner to capture a multi-dimensional movement adjacent to the circuit. In combination with any of the above embodiments, the signal processor circuit is configured to interpret the gesture from amplitude or phase data from the plurality of second receiver electrodes and from frequency data from the first activation receiver electrode. In combination with any of the above embodiments, the first activation receiver electrode is adjacent to the first transmitter electrode. In combination with any of the above embodiments, the plurality of second receiver electrodes are arranged to define a space to be monitored.

Embodiments of the present disclosure include an apparatus, formed in combination with any of the above embodiments.

Embodiments of the present disclosure include a method to perform or operate any of the embodiments described above.

Embodiments of the present disclosure may include a self-starting transmitter-detector assembly that can activate and strongly couple a transmitter signal to a nearby body, stylus, finger, hand, or other object. Such an object may then pass the signal to other receivers. As a result, relative positions and changes of position of the object may be measured and translated into useful gestures. This may be accomplished with the same or different transmitters in combination with these receivers. The result may be capacitive, proximity, touch, or other sensors that are used in electronic devices such as mobile phones, touchscreens, computers, tablets, and other devices.

DETAILED DESCRIPTION

Embodiments of the present disclosure may include a self-starting transmitter-detector assembly that can activate and strongly couple a transmitter signal to a nearby body, stylus, finger, hand, or other object. Such an object may then pass the signal to other receivers. As a result, relative positions and changes of position of the object may be measured and translated into useful gestures. This may be accomplished with the same or different transmitters in combination with these receivers. The result may be capacitive, proximity, touch, or other sensors that are used in electronic devices such as mobile phones, touchscreens, computers, tablets, and other devices.

Design requirements of sensors already in use pose various challenges. Some devices may require a 10 MOhm bias resistance at the input of the receiver terminal and greater than 10 Mohm in the signal filters. This may use excessive die area in manufacturing semiconductor devices which leads to increased manufacturing cost. Received signals may have a high dependence upon pad capacitance with respect to ground. Susceptibility to the non-linearity of this capacitance leads to performance limitations.

Some sensing methods require, e.g., five RX channels and a TX electrode with an area almost equal to that of the overall application PCB. Such solutions may use 12-bit analog-to-digital-conversion (ADC) resolution and over 1000 samples per measurement. Nevertheless, to achieve similar performance to legacy sensing methods, the various embodiments according to this disclosure may use as few as 3 RX channels along with a smaller TX electrode.

According to various embodiments of the present disclosure, a very high resolution sensing is allowed with lower resolution electronic instrumentation. This may be based upon conditions wherein the mechanical and capacitive system changes slower than the sampling frequency which must be slower than half the carrier frequency (i.e. the analog oscillator frequency). For example, a 1/4000 of a change in physical capacitance may appear, after about sixty cycles of an analog oscillator, as a 40 mV change in a measurement circuit. This translates into about a 1/50 change for a 2V range of measurements, which translates to roughly 6-bit ADC resolution.

Analog oscillators designed under the principles of satisfying the Barkhausen criteria are notoriously problematic to simulate and have numerous parasitic sensitivity issues and behavioral artefacts that are rarely considered. In the present disclosure, various embodiments make use of some of the behavioral idiosyncrasies of the circuit, such as an over-driven/saturation mode, and a decaying transient burst mode. By design, various embodiments' performance is largely unaffected by some of these circuit idiosyncrasies.

According to various embodiments, an analog circuit is expandable to multiple channels, each with a specially designed open loop transfer function, having weighted channel summation and closed loop operation about a self-triggered oscillation point forms a capacitive sensor with several modes of operation.

FIG. 1 illustrates an example of a simplified model of a circuit 100 for detecting changes in capacitance or other signals, according to embodiments of the present disclosure. The capacitance and resistance elements in circuit 100 may illustrate the equivalent impedances associated with the receiver and transmitter electrodes. A system for detecting changes in capacitance or other signals may include multiple receiver channels. Furthermore, such a system may include multiple transmitter channels.

Circuit 100 may represent a CVD circuit for calculating capacitance between a transmitter circuit, antennae, or electrode 104 and a receiver circuit, antennae, or electrode 112. The capacitance may be represented by C 106. The capacitance may be related to distance of an object to an electrode in a device in which circuit 100 resides. Circuit 100 may be implemented in any suitable device for detecting touch or proximity, such as a touch screen, computer, or mobile device. A source 102 may issue a transmit signal to transmitter circuit 104. The transmit signal may be a sinusoidal signal. The transmit signal may be sent to the environment, whereupon objects such as hands, a stylus, or a finger may interact with the transmit signal. Resultant signals from the environment may in turn be received by receiver circuit 112 and measured. The gain of Rx/Tx may be calculated. The resultant signals and gain may be analyzed to determine C 106. Once C 106 is determined, touch or proximity values may be further calculated. Circuit 100 may include a resistor R 110 and an inherent capacitance ($C_O$) 108. $C_O$ 108 may be due to particular die or device characteristics. $C_O$ 108 may be constant.

In FIG. 1, source 102 may be an independent source, in that its voltage signal might need to be known and separate from the operation occurring elsewhere in circuit 100. However, in some embodiments, circuit 100 may include a source. Such a source may experience parasitic capacitance present for other portions of circuit 100. Such a source may be built on the same die or package as circuit 100, as opposed to an independent source.

The gain of circuit 100 may be given as:

$$\frac{RX}{TX} = \frac{sRC}{1 + sR(C + C_O)}$$

$$\frac{RX}{TX} \approx \frac{C}{C + C_O}, R \gg 1/s(C + C_O)$$

$$\frac{RX}{TX} \approx sRC, R \ll 1/s(C + C_O)$$

Using this, the output signal of source 102 may be used to drive transmitter circuit 104, the signals received by receiver circuit 112 may be received and measured, and a value for C 106 calculated assuming that the values of R 110 and $C_O$ 108 are constant.

However, the value of R 110 may be outsized and cause problems. Such an outsized condition may exist if R 110 is much greater than "$1/s(C+C_O)$". The value of $C_O$ 108 might not be known. If the value of $C_O$ 108 is in fact much greater than the value of C 106, then there might be low voltage gain and low current gain experienced by circuit 100, and thus the signals received by receiver circuit 112 hard to detect. If the value of $C_O$ 108 is in fact much less than the value of C 106, then there may be low sensitivity. Accordingly, a value for R 110 may be selected that is low in comparison to "$1/s(C+C_O)$".

In one embodiment, source 102 may be removed as an independent source and, instead, integrated as a source within the rest of circuit 100 or other elements.

FIG. 1 illustrates a receiver channel model for cases where impedance predominantly capacitive. The equivalent capacitance C 106 between circuits 104 and 108 may vary with motion of the external hand, finger, stylus, or other object. As discussed above, $C_0$ 108 in semiconductor integrated circuits may be dominated by the non-linear capacitance of the elements of the die or the integrated circuit pad. The value of R 110 may be chosen by design. When the value of R 110 is made very small, receiver circuit 112 stage transfer function is effectively independent of $C_0$ 108. While it is true that the voltage gain also decreases, this need not be a problem since, in principle, R 110 can be made approximately or exactly zero if the current through it is used as the measured input instead of the voltage across it.

If the input impedance for receiver circuit 112 is low but non-zero, then a voltage input may be used and the effects of $C_0$ 108 may be partially eliminated. If the input impedance for receiver circuit 112 is zero, then a current input may be used and the effects of $C_0$ 108 may be eliminated. If input for receiver circuit 112 is tied through a resistor before an input gate of a MOSFET (such as in a comparator or other transistor-based operator), then smaller electrostatic discharge protection may be needed. Furthermore, a bandpass filter might be applied right at the input. Otherwise, if input for receiver circuit 112 is tied directly to an input gate of a MOSFET, there might be no possibility of a bandpass filter right at the input, but a smaller component count might be needed. In one embodiment, operation of a system using circuit 100 may be performed at saturation mode when capacitance between transmitters and receiver increases (wherein such an increase indicates an approach of an objects). In another embodiment, capacitance between transmitters and receiver may decrease (wherein such a decrease indicates an approach of an objects) when using a burst mode.

Figure 2:
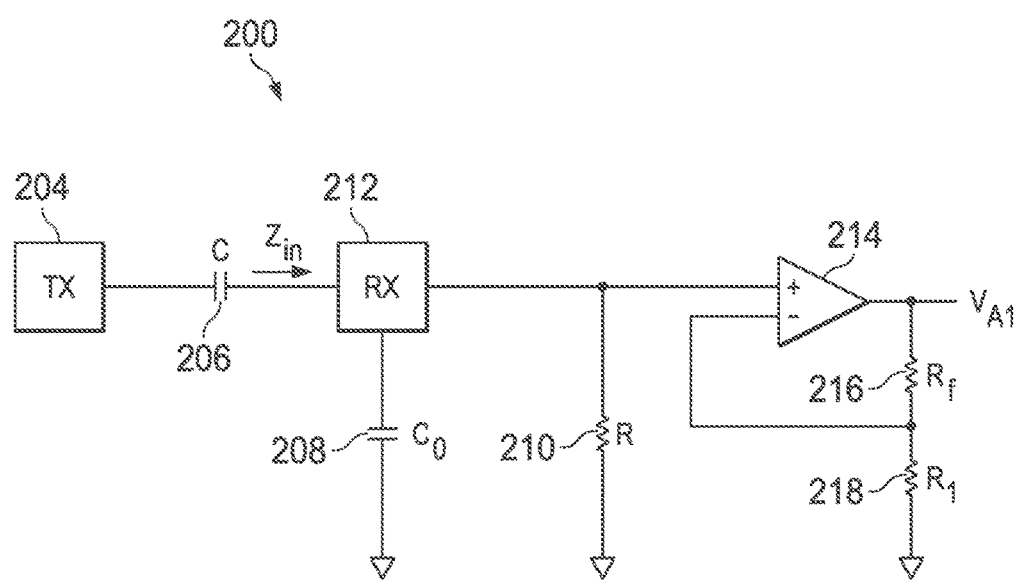
FIG. 2 is an illustration of a receiver input stage, according to embodiments of the present disclosure.

FIG. 2 is an illustration of a receiver input stage, according to embodiments of the present disclosure. In order to process the measurements from a receiver circuit, stage 200 may add enhancements to circuit 100. For example, output of receiver circuit 212 may be applied to an op-amp 214. The output of op-amp 214 may be connected to a resistor divider, included resistors 216, 218 and feedback to op-amp 214. The gain of stage 200 may be given as:

$$\frac{V_{A1}}{TX} = \frac{sRC}{1+sR(C+C_0)} \cdot \left(1 + \frac{R_f}{R_1}\right)$$

Figure 3:
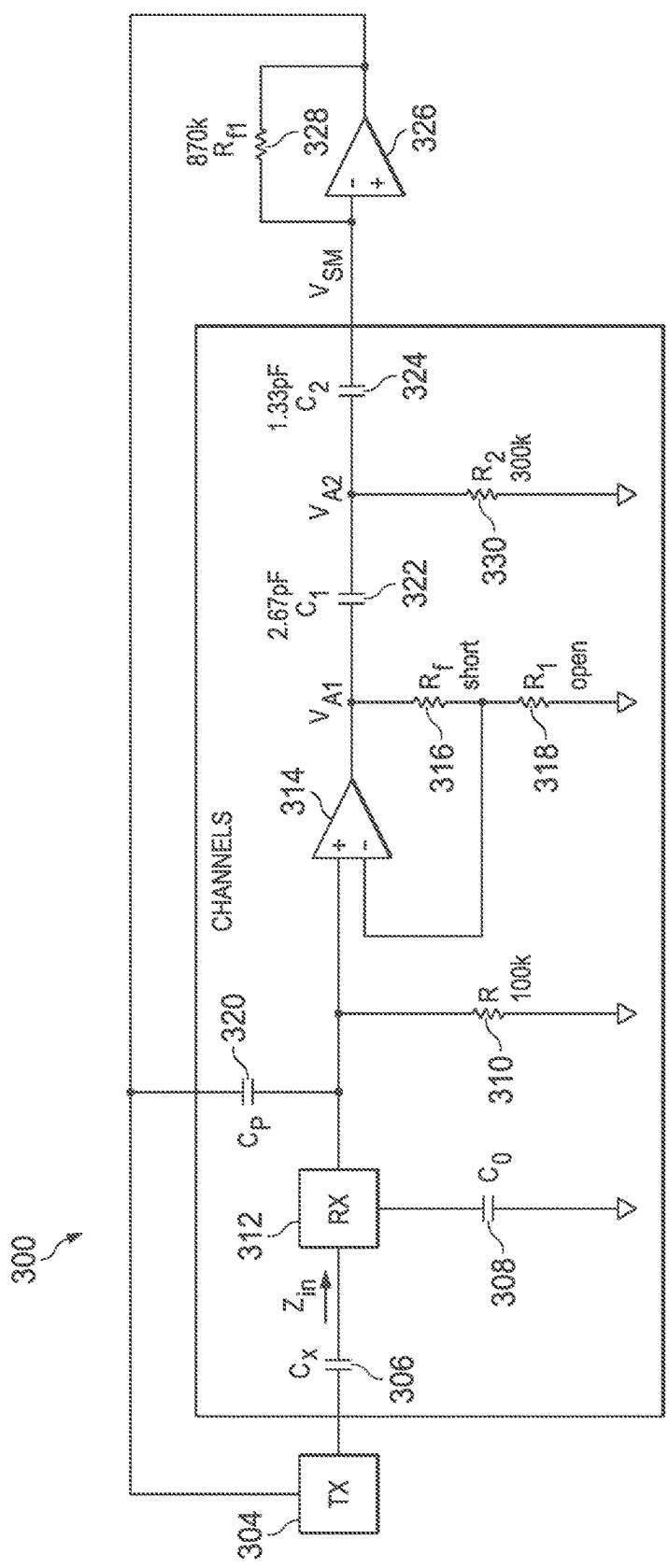
FIG. 3 is an illustration of a capacitive sensor circuit, according to embodiments of the present disclosure.

FIG. 3 is an illustration of a capacitive sensor circuit, according to embodiments of the present disclosure. FIG. 3 may illustrate a capacitive sensor circuit comprising the receiver input stage 200 of FIG. 2. Furthermore, the capacitive sensor circuit may include a feedback control loop filter, transmitter output stage, and transmitter-receiver electrode array, all connected in a feedback control loop. For example, to the output of op-amp 314, a series of capacitors 322, 324 may be added, divided by a resister 300. The output of capacitor 324 may be applied to another op-amp 326 with a resistor 328 in feedback, the output of op-amp 326 routed to a transmitter and another capacitor 320. Elements C1, R1 and C2 form part of the loop filter. Sinusoidal or AC current in C2 is fed to the transmitter output stage formed by the opamp and Rf1. The opamp in the transmitter output stage drives the transmitter electrode and may also be routed to another capacitor CP 320 of known or controllable value. This latter capacitor CP is connected in parallel to the unknown capacitance to be measured between transmitter and receiver electrodes.

Moreover, portions of stage 300 may be replicated multiple times to implement multiple receiver channels. For example, elements 306, 312, 320, 314, 322, 324, 308, 310, 316, 318, and 330 may be included in a receiver stage that is replicated for as many receiver channels are needed.

The topology of stage 300 offers voltage input, no possibility of bandpass filter at input, and low IDD/precision (decaying burst) mode of operation when an object is closer to electrodes.

The value of capacitor Cp 320 may be known and a control value to balance out effects of Cx 306. The value of capacitor Cp 320 may be selected to pull operation of stage 300 back into an acceptable operation range. The total capacitance, C, that will be measured by receiver circuit 312 may include a total capacitance of both Cp 320 and Cx 306. Accordingly, the gain of stage 300 may be given as:

$$\frac{V_{A1}}{TX} = \frac{sRC}{1+sR(C+C_P)} \cdot \left(1 + \frac{R_f}{R_1}\right)$$

$$\frac{TX}{V_{A1}} = \frac{-s^2 R_2 C_1 R_{f1} C_2}{1+sR_2(C_1+C_2)}$$

$$LoopGain, T = \frac{-s^2 R_2 C_1 R_{f1} C_2}{1+sR_2(C_1+C_2)} \cdot \frac{sRC}{1+sR(C+C_0)} \cdot \left(1 + \frac{R_f}{R_1}\right)$$

The angle of the gain at the oscillation threshold, assumed to be zero, may be given as:

$$\angle T = 90° - \tan^{-1} \omega R_2(C_1+C_2) - \tan^{-1} \omega R(C+C_0) = 0°$$

Consequently, the equation may be rewritten as:

$$\Rightarrow 90° = \tan^{-1} \omega R_2(C_1+C_2) + \tan^{-1} \omega R(C+C_0)$$

Wherein omega is the oscillation frequency of the stage. Restated, the equation may be expressed as:

$$\Rightarrow zero-phase-freq, \omega = \frac{1}{\sqrt{RR_2(C_1+C_2)(C+C_0)}} \quad (eq\ 1)$$

According to equation 1, when the stage is active, it oscillates at the frequency, omega. It varies upon the value of C, rather than directly upon an input source. Thus, the source no longer needs to be an independent source, as shown in FIG. 1 as source 102, but may instead by incorporated within a die also housing the receiver stages. The source can be affected by the same parasitic forces acting upon the receiver stages, and the measurement of the gain can nonetheless be calculated.

The absolute value of the gain may be expressed then as:

$$|T| = \left(1 + \frac{R_f}{R_1}\right) \frac{\omega^3 RCR_2 C_1 R_{f1} C_2}{\sqrt{1+\omega^2 R_2^2(C_1+C_2)^2} \sqrt{1+\omega^2 R^2(C+C_0)^2}} = 1 \quad (eq\ 2)$$

Equation 2 defines whether there will be oscillation. The threshold is when the gain is equal to 1. All other parameters might be known except the value of C, which is measured by the receiver circuit. For certain values of C, the gain is one. For higher values of C, the value of the expression of equation 2 is greater than 1, wherein there is oscillation. When the value of the expression of equation 2 is less than 1, there is no oscillation.

Accordingly, using equations 1 and 2, the oscillation frequency of the stage may be expressed as:

$$\Rightarrow \omega = \frac{R_1/(R_1+R_f)}{R_{f1}C_1 \| C_2 \cdot C/(C+C_0)} \sqrt{\left(1 + \frac{R_2}{R}\frac{C_1+C_2}{C+C_0}\right)\left(1 + \frac{R}{R_2}\frac{C+C_0}{C_1+C_2}\right)} \quad (eq\ 3)$$

Applying equations 1 and 3 gives the following relationship:

$$\frac{R_1/(R_1+R_f)}{R_{f1}C_1 \| C_2 \cdot C/(C+C_0)} = \frac{1}{R(C+C_0) + R_2(C_1+C_2)} \quad (eq\ 4)$$

Equations 3 and 4 may be used to express relationships to help a designer of a receiver stage to pick values of resisters and capacitors to create thresholds for C at which the receiver stage will oscillate and measure.

Accordingly, for the circuit of FIG. 3, when the measured C goes between a certain value, the circuit oscillates with the transmitter stage portion driving the oscillation and the receiver stage portion receiving the oscillation in tandem. When C goes above a certain value, the oscillation dies out and may appear as a decaying burst. Thus the oscillation may depend on C. Accordingly, in one embodiment, receiver circuits and stages do not need to be specifically polled nor do transmitter stages need to be externally driven, but instead are activated when the value of C reaches the oscillation threshold.

For certain values of C, the absolute value of T is 1. If C goes up, the absolute value of T goes less than 1, wherein there is no oscillation.

Nonetheless, equation 1 illustrates that $C_0$ 308 is still a factor to consider. However, the equations show that $C_0$ 308 effects can be minimized if C is greater than $C_0$ 308. In fact, making C two or three times bigger than $C_0$ 308 may significantly reduce the impact of $C_0$ 308 and the impact of variation in $C_0$ 308 between different instances of stage 300. Given that C is the sum of Cx 306 (the actual capacitance between the transmitter and receiver) and Cp 320, once a range of Cx 306 is specified, a value for Cp 320 can be chosen. Choosing too big a value for Cp 320 means Cx 306 (which needs to be measured precisely) may become small compared to Cp 320. However, one advantage of this method may include that even if Cp 320 is much larger than Cx 306, the sensitivity of the circuit about the self-sustained oscillation balance state is largely unchanged. Furthermore, while setting large values for Cp 320 may reduce sensitivity in the amplitude measurement, the distribution of Cp 320 over the various channels may be weighted to retain good amplitude measurement sensitivity. Furthermore, emphasis may be placed on making phase measurements instead. Note that the omega-cubed term equation 2 has the highest power and hence dominates in a practical sense. From equation 1, when C increases (typically the result of an object approaching the receiver electrode array), operational frequency tends to decrease and so does T. Thus, decaying burst mode is entered when an object crosses the specified boundary and moves closer to the electrode assembly, which is a feature of the present disclosure and topology. Knowing the value of Cx 306 for a given object and position allows the designer to set Cp 320 so as to set the physical boundaries of the various modes of operation. Many degrees of freedom in the design of stage 300 allow for adjusting/choosing the typical frequency of operation as well as to optimize for size.

Figure 4:
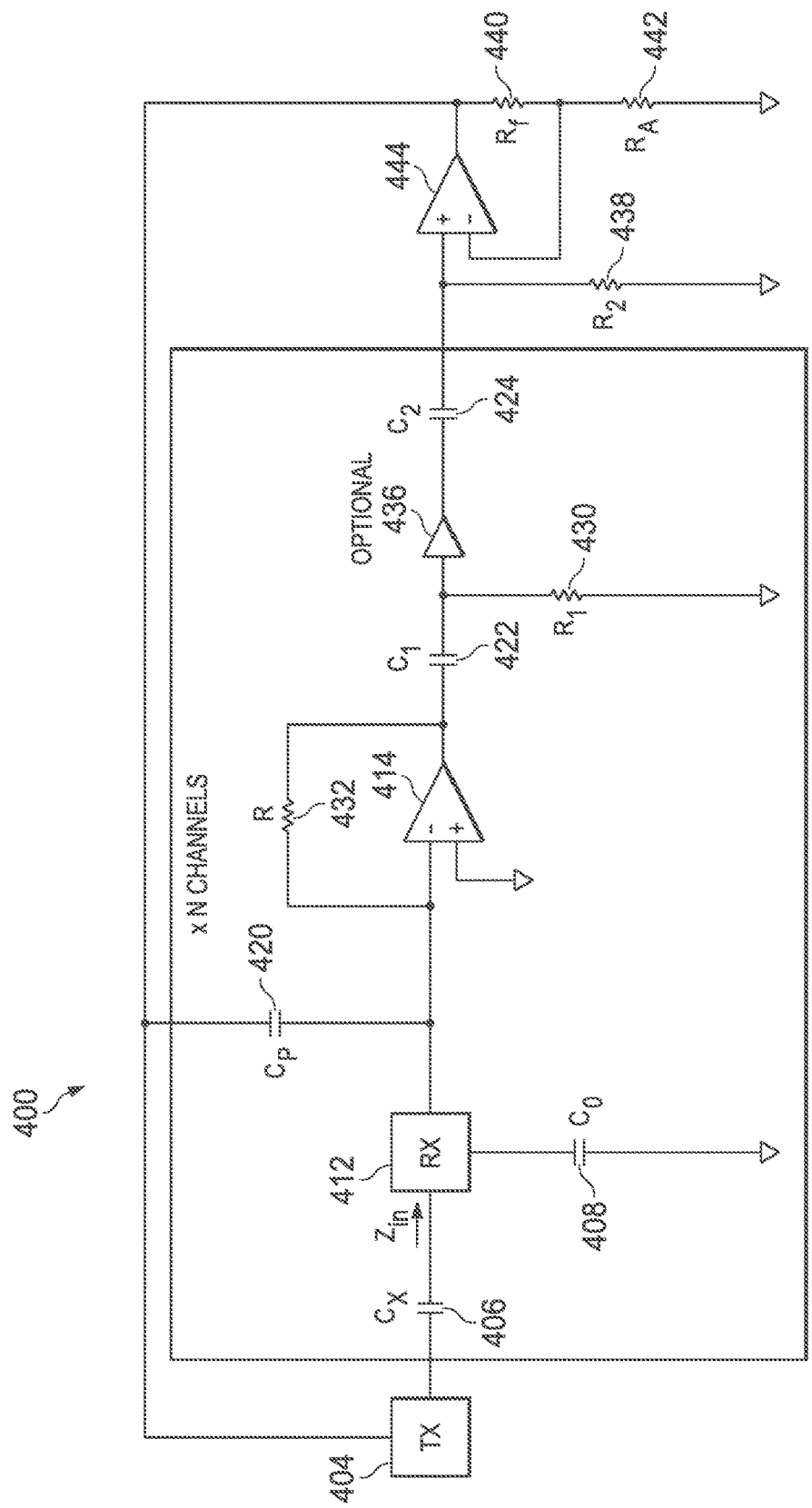
FIG. 4 is an illustration of another capacitive sensor circuit, according to embodiments of the present disclosure.

FIG. 4 is an illustration of yet another capacitive sensor circuit, according to embodiments of the present disclosure. Circuit 400 may be considered a variation of circuit 300 with the receiver input stage used in place of the transmitter output stage and vice versa. Op-amp 444 with output routed to resistive divider Rf and RA and fed back to the negative input may form the transmitter output stage, whereas op-amp 414 with feedback resistor R 432 may from the receiver input stage. The output of op-amp 444 may be routed to the transmitter. In order to process the measurements from a receiver circuit, stage 400 may add enhancements to FIGS. 1-3. For example, to the output of op-amp 414, a series of capacitors 422, 424 may be added, divided by a resister 430 and an optional gain op-amp 436. A feedback resistor 432 may be connected to the output of op-amp 414 back to the negative input. The output of capacitor 424 may be applied to another op-amp 444 and a resister 438 in parallel. The output of op-amp 444 may be routed to a resistor divider network made up of resistors 440, 442 fed back to the negative input. The output of op-amp 444 may be routed back to the transmitter.

Moreover, portions of stage 400 may be replicated multiple times to implement multiple receiver channels. For example, elements 406, 412, 420, 414, 432, 422, 436, 424, 430, and 408 may be included in a receiver stage that is replicated for as many receiver channels are needed The topology of FIG. 4 offers current input and operation that is independent of the value of $C_0$ 408. Moreover, there are fewer or smaller components, and there is a precise decaying-burst mode when an object approaches the receiver.

The loop gain of the topology of FIG. 4 may be given as:

$$Loop\,Gain,\ T = \frac{-sRC \cdot s^2 R_2 C_2 R_1 C_1}{1 + s[R_1(C_1+C_2) + R_2 C_2] + s^2 R_2 C_2 R_1 C_1} \cdot \left(1 + \frac{R_f}{R_A}\right)$$

The frequency may be established as:

$$zero - phase - freq,\ \omega = \frac{1}{\sqrt{R_1 R_2 C_1 C_2}}$$

Thus, in a balanced mode, the frequency is independent of C. However, in saturation mode, it is not.

The gain may be rewritten as:

$$|T| = \left(1 + \frac{R_f}{R_A}\right)\frac{RC}{[R_1(C_1+C_2) + R_2 C_2]}$$

The design in FIG. 4 may have the effect of being active, or oscillating, when C is above a designated design value.

Figure 5:
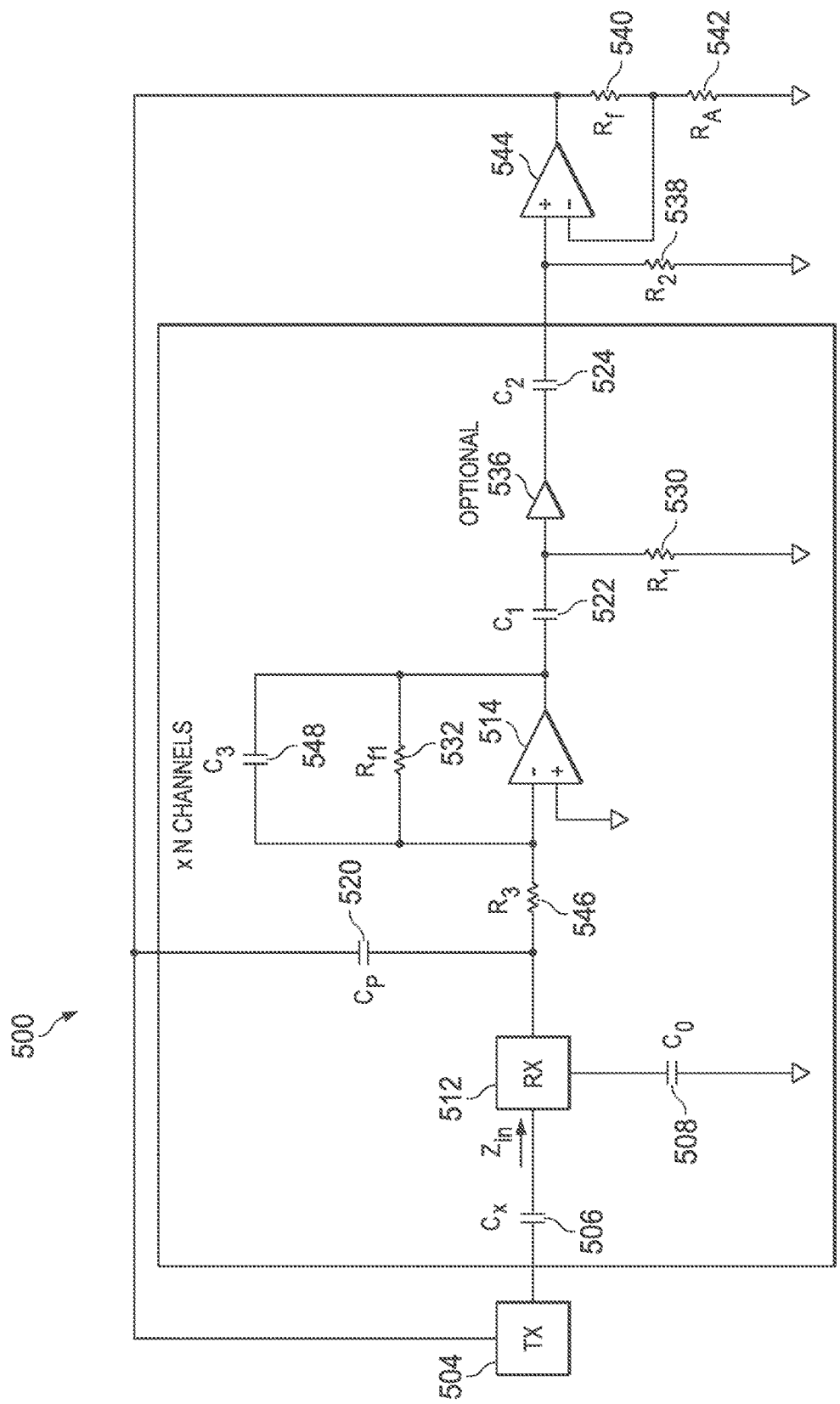
FIG. 5 is an illustration of yet another capacitive sensor circuit, according to embodiments of the present disclosure.

FIG. 5 is an illustration of yet another capacitive sensor circuit, according to embodiments of the present disclosure. Circuit 500 may be a variation of the implementations above. Specifically, stage 400 may add an input resistor 546 to op-amp 514 and a loopback capacitor 548 from the output of op-amp 514 to its negative input, in parallel with resistor 532. This topology may provide a bandpass filter, but does not completely eliminate the effects of $C_O$ 508. In such a topology, the system frequency should be just lower than the high-pass corner frequency of the bandpass filter for minimizing component count.

For each of the topologies in FIGS. 3-5, band-pass filters, buffers, and pairs of inverting amplifiers may be added if deemed advantageous at the cost of additional component count. Channels may be built of the same or different topology versions depending on objectives/feature set. That is, multiple receiver channels in a system may be individually selected from different ones of the topologies of FIGS. 3-5.

Figure 6:
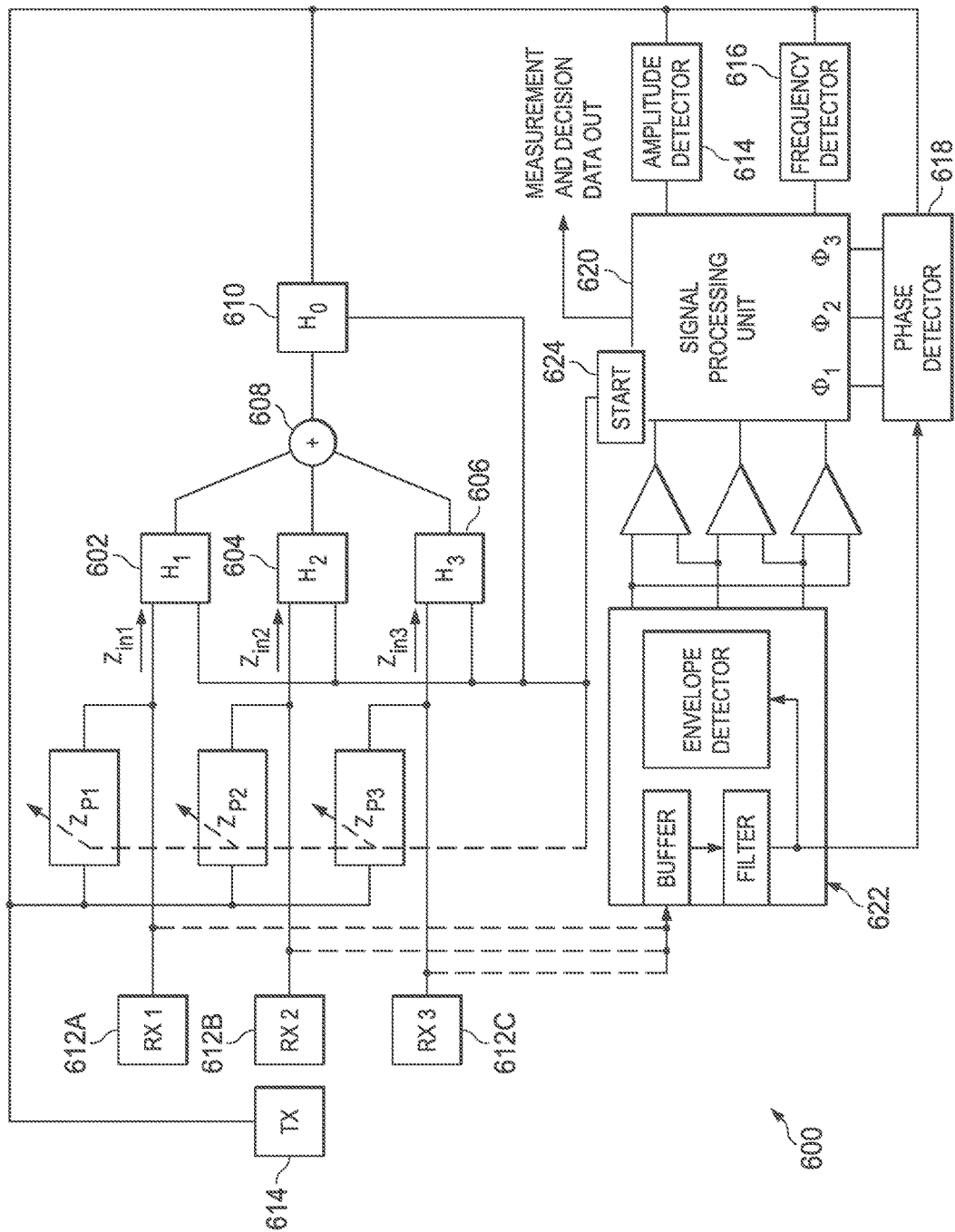
FIGS. 6 and 7 illustrate an example systems incorporating sensor circuits that sense impedance changes, according to embodiments of the present disclosure.

FIG. 6 illustrates an example system incorporating receiver circuits that sense impedance changes, according to embodiments of the present disclosure. System 600 may include one or more receiver stages 602, 604, 606. Each one of receiver stages 602, 604, 606 may be implemented by one or more of the implementations illustrated in FIGS. 1-5. Moreover, individual receiver stages 602, 604, 606 may be implemented by different ones of the stages illustrated in FIGS. 1-5 with the same instance of system 600. System 600 may be implemented within a computer, mobile device, tablet, or other device for determining proximity or touch detection, or other capacitance sensing. System 600 may, given input signals received from receiver circuits 612 and receiver stages 602, 604, 606, determine whether or not an object is approaching or has touched a sensor. This determination may be issued as measurement and decision data output.

System 600 may include a sensor core, including a transmitter circuit 614, receivers 612, receiver stages 602, 604, 606 an adder 608, and a resulting input signal 610 generated from a sum, addition, or other combination of signals from receiver stages 602, 604, 606. Each of receiver stages 602, 604, 606 might activate, or oscillate, when a measured capacitance C (including internal capacitance to the receiver stage and capacitance between respective receivers 612 and transmitter 614) are above or below (depending upon the implementation of the receiver stages) a designated value. The designated value may be set according to application needs, such as values corresponding to particular objects (gloved or ungloved hands), protected or unprotected touch surfaces, distances, or other suitable criteria.

System 600 may include a signal parameter measurement and processing core, including an envelope detector 622, signal processor 620, amplitude detector 614, frequency detector 616, and phase detector 618. Each of envelope detector 622, amplitude detector 614, frequency detector 616, and phase detector 618 may be implemented in suitable circuitry and provide measurements of received signals from receiver stages 602, 604, 606 to fulfill calculations as demonstrated in FIGS. 1-5. The calculations may be performed by signal processor 620, which may be implemented in any suitable combination of digital and analog circuitry to perform the computations.

System 600 may include startup and timing control hardware and algorithms (labeled START 624).

Receiver stages 602, 604, 606 may perform transfer functions according to the implementations shown in FIGS. 2-5. The output of each may be summed and fashioned into a low impedance transmitter driver signal that is in turn fed back across the sensing space to the receivers. For a given transmitter-receiver electrode configuration, impedance elements Zpn, normally capacitors across Tx-Rxn in the immediate intended application, are set or varied by START 624 so that for a specified middle or boundary state of the sensing space the overall feedback loop gain of the feedback loop satisfies the Barkhausen Criteria for sustained self-oscillation. The sustained self-oscillation is discussed in more detail, above. The phase of the loop gain may be zero degrees and the magnitude of the loop gain may be one at the nominal frequency of operation. In such a nominal frequency of operation, the loop gain (T) is equal to Ho multiplied by the summation of the product of Hn and RXn/TX, where n is the channel number. In FIG. 6, three channels are shown as an example, but more or fewer may be used.

Sensor operation of system 600 may be defined relative to such a boundary state (wherein the phase of the loop gain may be zero degrees and the magnitude of the loop gain may be one at the nominal frequency of operation). First, in a self-sustained mode, the boundary state may be designed to be a rest state or zero state of the sensing space. Through a common-mode negative feedback loop the loop gain is modulated in response to impedance changes in the sensing space so as to maintain self-sustained oscillation. The modulation so required is measured and used as a measure of the deviation or change from rest state.

Second, in a saturation mode, the rest state is so offset from the boundary state such that the loop gain at the zero-phase frequency, designed to be the operational frequency, is greater than 1. The transmission oscillation is still sustained but is driven into saturation and distorted. However, its frequency still varies with impedance variations in the sensing space and can be used to detect and measure such variations.

Third, in a decaying-burst mode, the rest state is so offset from the boundary state such that the loop gain at the zero-phase frequency, also the operational frequency, is less than 1. By pinging the oscillator Tx-Rx loop with pulses from the start block, a transient burst of a decaying sinusoid is generated. The decay rate and frequency of each transient burst depends on the impedances in the sensing space and therefore these parameters can be measured to track impedance changes in the sensing space.

In all three modes just described, relative amplitude and phase measurements may be used to glean multidimensional information about impedance changes in the sensing space and can hence be used to map out, triangulate or detect in two- and three-dimensional space.

Design of START 624 and signal processor 620 may be customized according to the application to which the system will be applied, in particular to the system specifications and feature set. Nevertheless, various embodiments may follow several design considerations. If negative feedback loops are used to maintain self-sustained oscillation, care might be taken that sufficient gain-margin and phase margin is maintained in all loops in all cases. The same recommendation may apply for the main sensor core loop. Furthermore, to avoid high-frequency noise problems filters may be used to minimize bandwidth without adversely affecting system performance. Also, depending on which measurement parameters are most useful, some measurement blocks may be removed entirely. Furthermore, a clock signal for timing control may be used but is may be unnecessary in some cases. Also, Zp control may be accomplished by varactor-type voltage control or by binary bank selection or digital control. Furthermore, the natural existence of many different but interrelated measurement parameters may make neural network control and signal processing attractive. Also, the receiver signals fed to the processing block might not need to come directly from the pads. They may come more naturally after the first stage of Hn. Similarly, receiver buffers and filters might not need to be separate from the sensor core but may be part of the Hn block.

Figure 7:
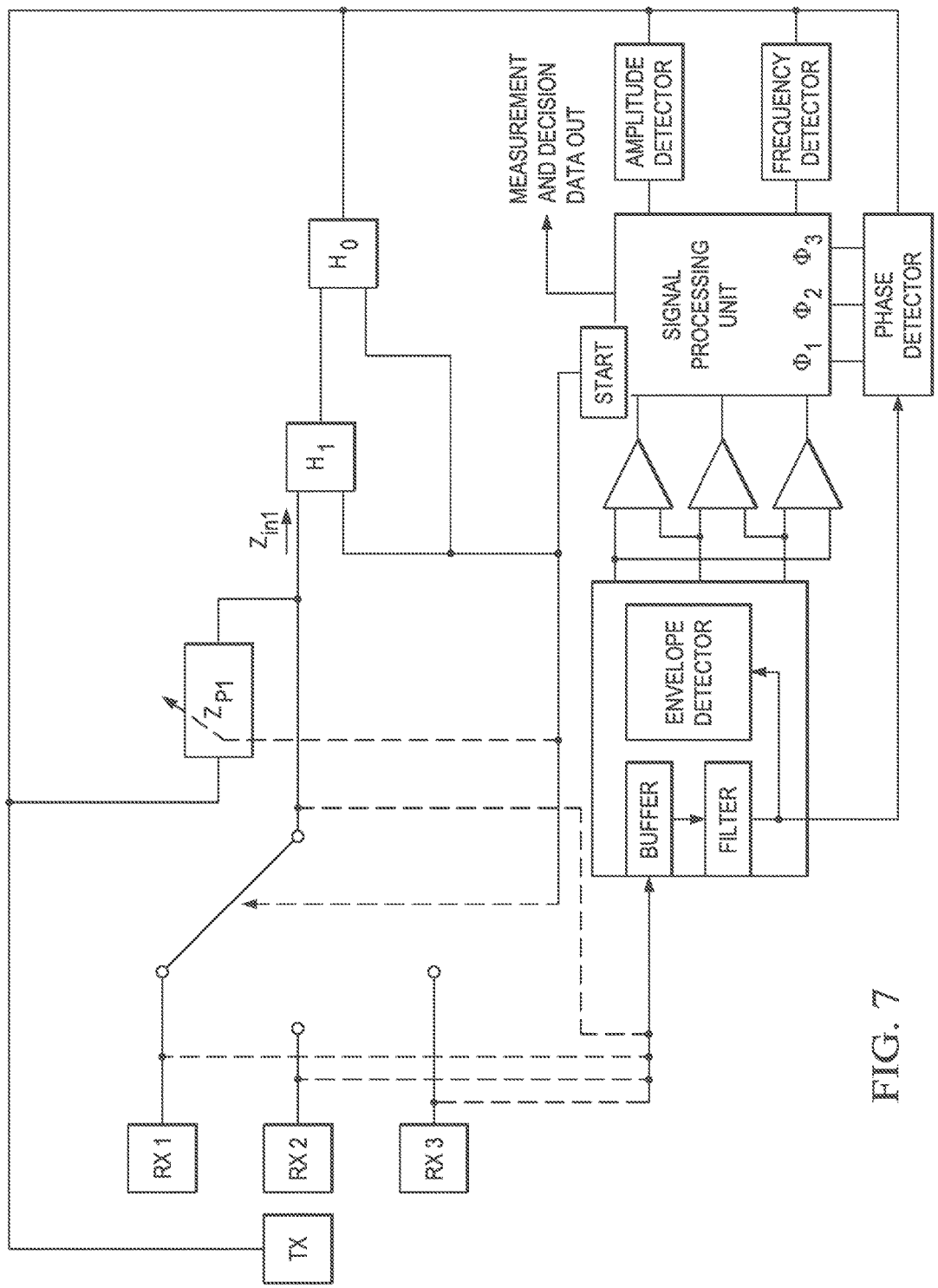

Due to the positive or regenerative feedback intrinsic to the various embodiments, greater sensitivity may be possible. If desired, hysteresis may easily be added into the design to prevent rapidly going back and forth between modes. If desired, switches and analog multiplexers may be used to add more channels or electrodes as shown in FIG. 7.

Using the elements of FIGS. 1-7, the new methods of sensing allow for self-triggered transmitter signals and the choice of amplitude, phase, and frequency measurements on the receiver channels. Accordingly, new transmitter-receiver configurations are possible that may be customized and weighted to maximize the usefulness of particular choices of measurements on certain electrodes. In one embodiment, using the elements of FIGS. 1-7, until an object approaches, no part of the sensor or measurement system need issue any oscillating signals. Instead, the ambient capacitance between transmitters and receivers might be measured. The receivers of FIGS. 1-7 might not oscillate until the capacitance between the receiver and the transmitter (including endemic capacitance) reach a low or high capacitance threshold. Then, the transmitter might be activated in order to make a more precise detection of the object that has approached.

Other systems may require continual issuance of sinusoidal or other output signals from transmitters. Furthermore, other systems may require continual checking of values by receivers, wherein polling is continuous or periodic. In contrast, embodiments of the present disclosure do not require issuance of an output signal from transmitters to determine an object has approached. In one embodiment, when the receiver is neither approached nor touched, there is no receiver or transmitter signal issued. Instead, the receiver activates or oscillates only upon an approach by an object that sufficiently affects the capacitance between the transmitter and receiver. Subsequently, the transmitter may be activated with a sinusoidal signal and the receiver may be activated to receive the deflection or distorted version of such a signal (as affected by the approaching object) and calculate capacitance, proximity, or touch.

Figure 8:
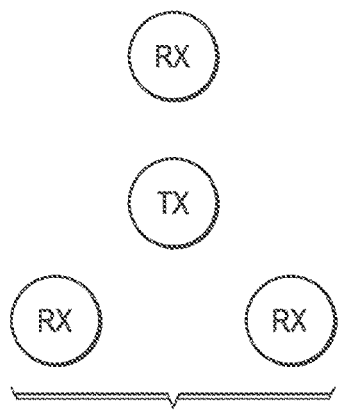
FIG. 8 illustrates an arrangement and configuration of a transmitter electrode and receiver electrodes, according to embodiments of the present disclosure.
Figure 9:
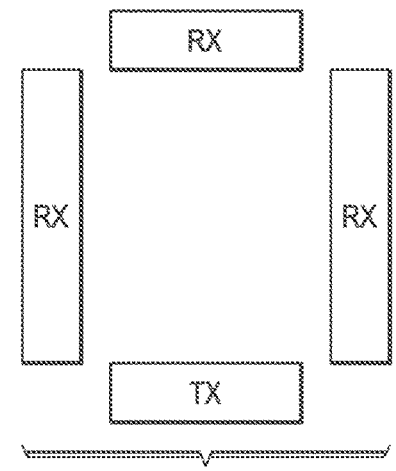
FIG. 9 illustrates another arrangement and configuration of a transmitter electrode and receiver electrodes, according to embodiments of the present disclosure.

The transmitter and receiver electrodes and circuits and arrays may follow configurations already in widespread use. FIG. 8 illustrates an arrangement and configuration of a transmitter and receivers. As shown in FIG. 8, a transmitter electrode may be centered relative to receiver electrodes around it. In other cases, FIG. 9 illustrates another arrangement and configuration of a transmitter and receivers. As shown in FIG. 9, the transmitter electrode may be offset from center to allow room for other circuitry and system components, such as a display screen.

Figure 10:
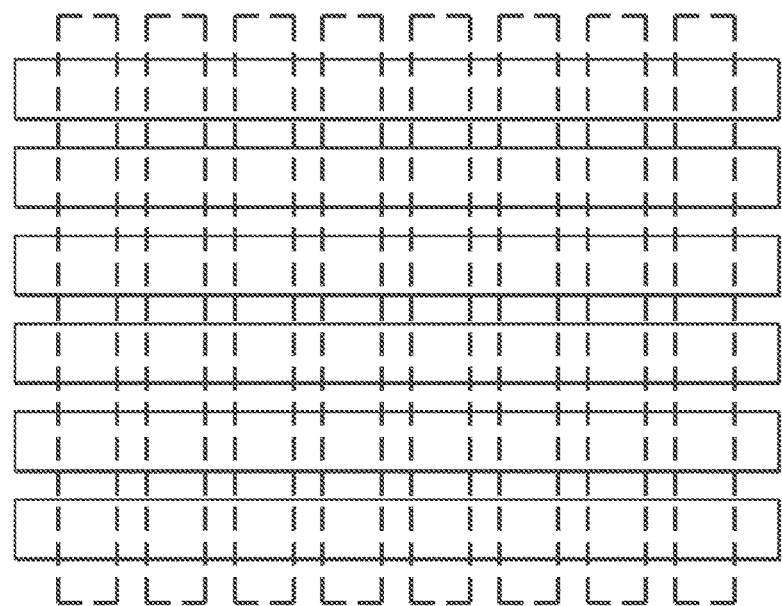
FIG. 10 illustrates yet another arrangement and configuration of a transmitter and receivers, according to embodiments of the present disclosure.

FIG. 10 illustrates yet another arrangement and configuration of a transmitter and receivers. In FIG. 10, the transmitter electrode, the receive electrodes or any combination of both types of electrodes may be split or shared by multiple electrodes or may be selectively switched over multiple electrodes or combinations of electrodes.

Figure 11:
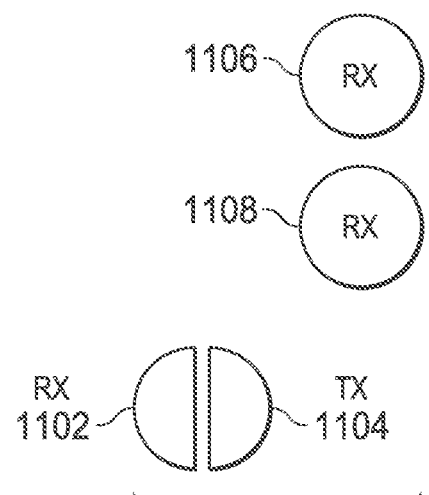
FIG. 11 illustrates an arrangement of a receiver electrode closely coupled to a transmitter electrode, according to embodiments of the present disclosure.

FIG. 11 illustrates an arrangement of a receiver electrode closely coupled to a transmitter electrode, according to embodiments of the present disclosure. Specifically, receiver electrode 1102 may be closely coupled to transmitter electrode 1104. Receiver electrode 1102 may be weighted (with respect to its input signals) so as to be the dominant electrode in setting the frequency of transmitter electrode 1104. The frequency of transmitter electrode may be established as the system frequency.

In one embodiment, perturbations in the sensing space about receiver electrode 1102 may in turn dominate the variations in frequency measurements with respect to other receiver electrodes 1106, 1108. Therefore, frequency measurements would be most useful for the channel and stage associated with receiver electrode 1102, compared to the other receiver electrodes. Meanwhile, the other receiver electrodes 1106, 1108 further from transmitter electrode 1104 could be weighted so that their received signal amplitudes would be the most useful measurement as it would be the measurement most sensitive to changes in sensing space associated with those RX electrodes. If those same receiver electrodes 1106, 1108 were so far away from transmitter electrode 1104 that the received signal amplitudes were relatively small, relative phase changes measured through zero-crossing phase detectors would be more reliable. The desired weighting of electrodes may be accomplished by design of the impedance, Zpn or by design of the transfer function block Hn, having an associated equivalent impedance, Zin.

Figure 12:
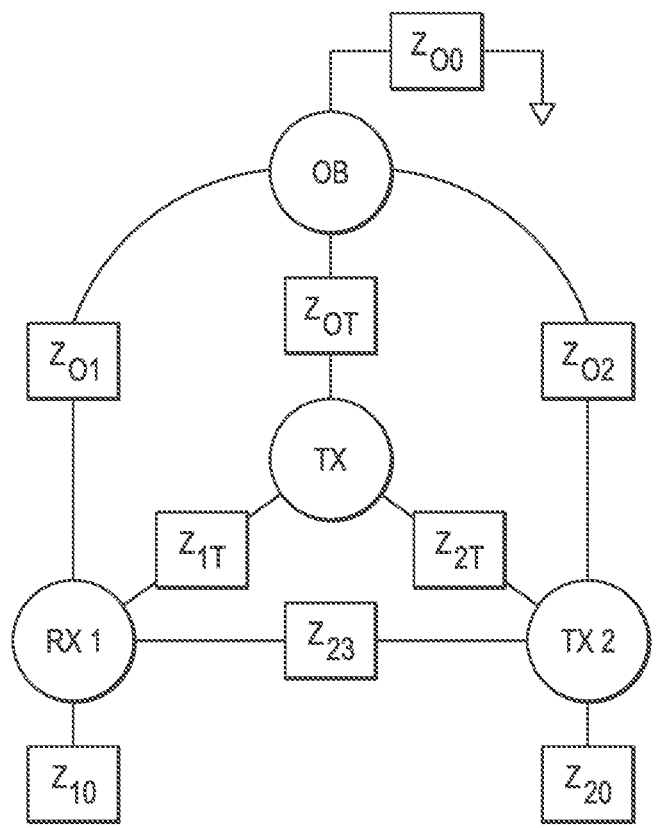
FIG. 12 illustrates an impedance network, according to embodiments of the present disclosure.
Figure 13:
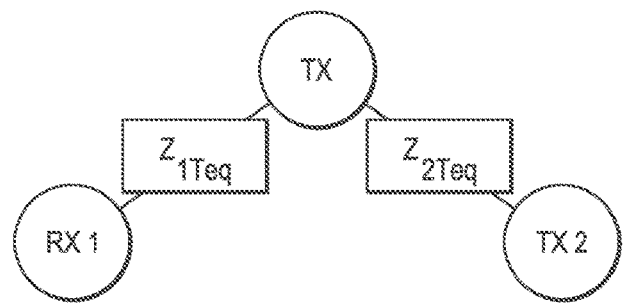
FIG. 13 illustrates a simplified impedance network model, according to embodiments of the present disclosure.

While the impedance network formed by the transmitter-receiver array in the sensing space can be quite complex, the circuit operation can be understood by considering only the equivalent impedance between each transmitter and receiver electrode pair. FIG. 12 illustrates an impedance network, according to embodiments of the present disclosure. FIG. 12 illustrates a case with one transmitter, two receivers, and one external object (OB). Each element in FIG. 12 may include impedances with respect to other elements and to ground. FIG. 13 illustrates a simplified impedance network model, according to embodiments of the present disclosure. The network of FIG. 12 can be reduced to the network of FIG. 13 wherein Zpn (from FIG. 12) are included in and contribute to ZnTeq (from FIG. 13) by design. In one embodiment, the effects of elements ZnO, impedance to ground, are to be minimized. Furthermore, given a noise source in series with ZnO, the impedance between a receiver electrode and ground can more easily and naturally be rejected by this method of sensing than by other methods presently available. Eliminating the effect of ZoO, impedance between the external object and ground, however, can be challenging when ZoO is very low compared to the other impedances in the network.

In the immediately intended application, the object may be a human hand, stylus, finger, or other object gesturing in air about the electrode assembly and the dominant impedances may be capacitances. The purpose of the various embodiments would then be to detect relative position and motion of the hand.

Returning to FIG. 11, an approach by an object—such as a thumb approach, close-hover, or touch—can cause a change in capacitance sufficient to trigger oscillation of a receiver electrode 1102. After such triggering, transmission of sinusoidal or other signals may be made by the closely coupled transmitter electrode 1104. Transmitter electrode 1104, now activated, may also be relatively close to the object that activated receiver electrode 1102. If the body has sufficient electrical conductivity (like a human body) the signal from transmitter electrode 1104 travels across the palm and other fingers (or other electrically connected parts of the object) and couples over to other receiver electrodes 1106, 1108 or the original receiver electrode 1102. The signal may propagate to varying degrees depending on relative position of the nearest extensions (such as fingers) of the object. By measuring the relative amplitudes, (and possibly also phase of the received signals as well as the changes in frequency of the transmitter system operation frequency itself) sufficient information can be obtained to detect relative position and gestures.

This apparatus may then be used in applications ranging from touchpads, PC-mouse, pulse-rate monitor, and even a virtual typing keyboard. This apparatus can be included on a mobile smart-phone, tablet or similar device, with the electrode assembly mounted on the outer ring or edge of device. This may result, for example, in a simpler and more user-friendly implementation of a volume control. In such an implementation, relative measurements from receiver electrodes 1106, 1108 may be procured and analyzed to determine whether the object is gesturing up or down.

Figure 14:
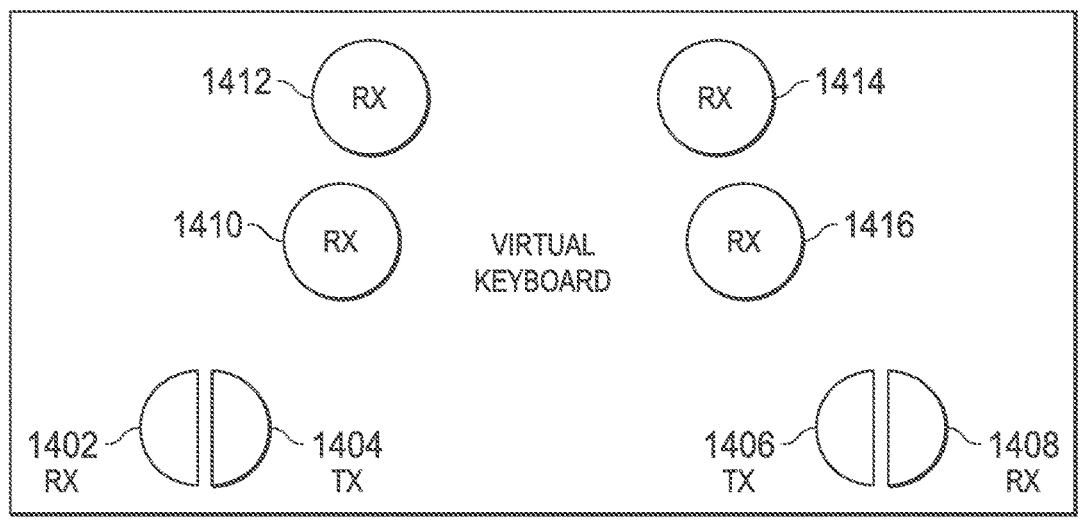
FIG. 14 illustrates a virtual keyboard electrode arrangement, according to embodiments of the present disclosure.

Using similar techniques, the system may be applied to two-dimensional or three-dimensional applications, such as mouse movement or virtual keyboards. For example, FIG. 14 illustrates a virtual keyboard electrode arrangement, according to embodiments of the present disclosure. Two closely-coupled transmitter-receiver pairs may be included. These may be receiver electrode 1402 and transmitter electrode 1404 on the left-hand side of a space, and receive electrode 1408 and transmitter electrode 1406 on a right-hand side of the space. Other receiver electrodes 1410, 1412, 1414, 1416 may define the space in which gestures will be identified and traced to operation of a virtual keyboard. By providing activation locations at the lower left and right corners, the resultant virtual keyboard may be automatically activated when the thumbs hover over the two activation locations just the way the thumbs would hover over a real keyboard space bar. Until one or both of receiver electrodes 1402, 1408 determine a sufficient change in capacitance, receiver electrodes 1402, 1408 might not be oscillating. Furthermore, transmitter electrodes 1404, 1406 might not be transmitting. In addition, receiver electrodes 1410, 1412, 1414, 1416 might be inactive. Once one or both of receiver electrodes 1402, 1408 detect a sufficient change in capacitance, transmitter electrodes 1404, 1406 may issue sinusoidal or other signals, and the deformed or changed versions of these may be detected by now-activated receiver electrodes 1410, 1412, 1414, 1416. The amplitude, phase, and frequency measurements may be collected from these receiver electrodes and interpreted as gestures in the form of keystrokes. "Shorter-reach" keystroke gestures (with respect to the electrodes) may be easier to pick-up by looking at the signal amplitudes at the receivers. The "far-reach" may cause more frequency shift in the transmitter signal while also causing a noticeable drop in receiver signal amplitude both of which can be used as tells in the decoding process.

The sensing system may be included on a mobile smart-phone, tablet or similar device, with the electrode assembly mounted on the outer ring or edge of device. Displays on the device could illustrate portions of the screen above which controls such as volume gestures are to be performed. Furthermore, two-dimensional mouse gestures could be made off to the side of the screen. In addition, the aforementioned virtual keyboard could be tracked to the bottom of such a device laid flat on a surface.

Figure 15:
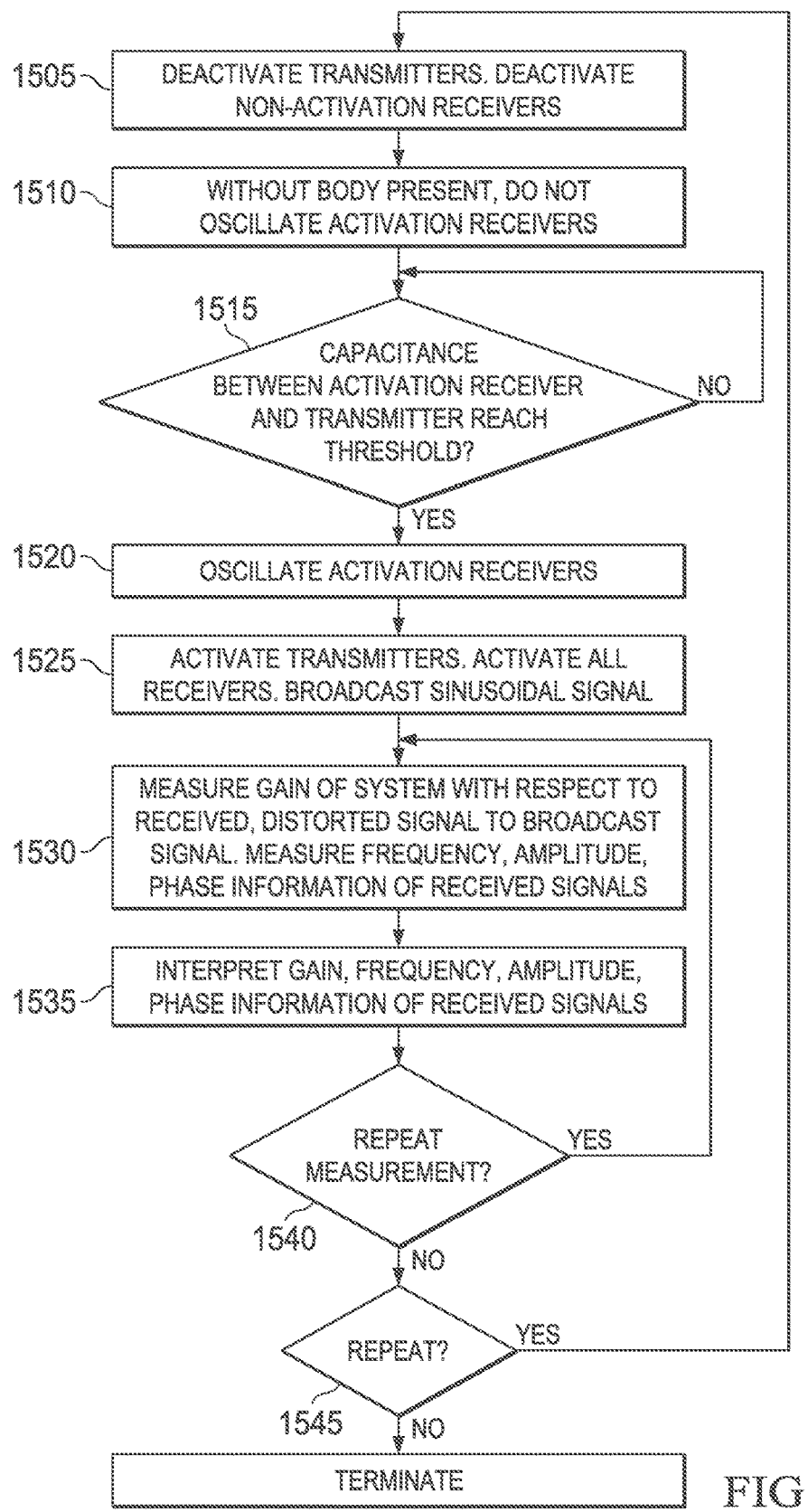
FIG. 15 illustrates a flow chart of a method for sensing capacitance changes, according to embodiments of the present disclosure.

FIG. 15 illustrates a flow chart of a method for sensing capacitance changes, according to embodiments of the present disclosure.

Method 1500 may be implemented by any suitable mechanism, such as the elements of FIGS. 1-14. Method 1500 may optionally repeat or terminate at any suitable point. Moreover, although a certain number of steps are illustrated to implement method 1500, the steps of method 1500 may be optionally repeated, performed in parallel or recursively with one another, omitted, or otherwise modified as needed. For example, 1520 and 1525 may occur simultaneously. Method 1500 may initiate at any suitable point, such as at 1505.

At 1505, transmitters may be deactivated. Moreover, non-activation receivers may be deactivated. At 1510, activation receivers might not oscillate or activate to propagate output signal.

At 1515, it may be determined whether capacitance has reached a threshold. The threshold may have reached a lower threshold after falling or an upper threshold after rising. The capacitance change may be due to an object approaching an activation receiver electrode. The capacitance determination may be made by a receiver stage configured to activate or oscillate only after a certain capacitance threshold has been reached. The capacitance may include capacitance between the activation receiver and a transmitter. The capacitance may also include capacitance internal to the activation receiver. In one embodiment, the capacitance measurements may be replaced by impedance measurements.

If capacitance thresholds have been reached, method 1500 may proceed to 1520. Otherwise, 1515 may repeat. At 1520, the activation receivers may oscillate.

At 1525, the transmitters may be activated. Other receivers may be activated. A broadcast signal may be provided to the transmitters.

At 1530, the gain may be measured. The gain may be of the system and receiver stages with respect to the received, distorted signal resulting from the broadcast signal interacting with a body. Furthermore, frequency, amplitude, and phase information of the received signals may be measured.

At 1535, the data collected may be interpreted as gestures.

At 1540, it may be determined whether measurements of the body's effects to be translated to gestures will continue. If so, method 1500 may repeat at 1530. Otherwise, method 1500 may proceed to 1545.

At 1545, it may be determined whether method 1500 will repeat. If so, method 1500 may repeat at, for example, 1510. Otherwise, method 1500 may terminate.

Although example embodiments have been shown above, changes, additions, subtractions, or other permutations may be made to these embodiments without departing from the spirit and scope of the present disclosure, according to the knowledge and ability of one of ordinary skill in the art.

The invention claimed is:

1. A proximity-activated gesture circuit, comprising:
   a feedback circuit formed by:
     a first activation receiver electrode coupled with an associated receiver circuit;
     a driver circuit having an input coupled with an output of the receiver circuit;
     a transmitter electrode coupled with an output of the driver circuit;
     a plurality of second receiver electrodes and associated receiver circuits;
   wherein the feedback circuit is configured to only oscillate when a first capacitance between the transmitter electrode and the first activation receiver electrode reaches a threshold; and
   a signal processor circuit configured to receive signals from the second receiver electrodes while said feedback circuit oscillates to determine a gesture.

2. The proximity-activated gesture circuit of claim 1, further comprising a second capacitance between the first activation receiver electrode and the transmitter electrode, wherein the second capacitance is coupled in parallel with the first capacitance.

3. The proximity-activated gesture circuit of claim 2, wherein the second capacitance has a controllable value.

4. The proximity-activated gesture circuit of claim 1, wherein one of the plurality of second receiver electrodes is configured as a second activation receiver electrode, wherein the feedback circuit is further configured to only oscillate when the first capacitance reaches a threshold or when a third capacitance between the transmitter electrode and the second activation receiver electrode reaches another threshold.

5. The proximity-activated gesture circuit of claim 4, wherein the plurality of second receiver electrodes is arranged to detect gestures in a virtual keyboard.

6. The proximity-activated gesture circuit of claim 1, wherein one of the plurality of second receiver electrodes is configured as a second activation receiver electrode, wherein the feedback circuit is further configured to oscillate when both:
the first capacitance reaches a threshold; and
a third capacitance between the transmitter electrode and the second activation receiver electrode reaches another threshold.

7. The proximity-activated gesture circuit of claim 6, wherein the first activation receiver electrode is placed at one edge of a space for detection, and the second activation receiver electrode is placed at an opposite edge of the space for detection.

8. The proximity-activated gesture circuit of claim 7, wherein the first activation receiver electrode and the second activation receiver electrode are placed at edges of a space representing a space bar of a virtual keyboard.

9. The proximity-activated gesture circuit of claim 6, further comprising an envelope detector coupled with the first and second activation receiver electrodes and said signal processing circuit.

10. The proximity-activated gesture circuit of claim 1, wherein the plurality of second receiver electrodes is arranged in a linear manner to capture a multi-dimensional movement.

11. The proximity-activated gesture circuit of claim 1, wherein the plurality of second receiver electrodes is arranged in a linear manner to capture a multi-dimensional movement adjacent to the circuit.

12. The proximity-activated gesture circuit of claim 1, wherein the signal processor circuit is configured to interpret the gesture from amplitude or phase data from the plurality of second receiver electrodes and from frequency data from the first activation receiver electrode, wherein:
the first activation receiver electrode is adjacent to the transmitter electrode; and
the plurality of second receiver electrodes are arranged to define a space to be monitored.

13. The proximity-activated gesture circuit of claim 1, further comprising a summation node receiving and summing output signals form the receiver circuits and feeding a summation signal into the driver circuit.

14. A method for proximity-activated gesture detection, comprising the steps of:
providing a feedback circuit formed by:
a first activation receiver electrode coupled with an associated receiver circuit;
a driver circuit having an input coupled with an output of the receiver circuit;
a transmitter electrode coupled with an output of the driver circuit;
a plurality of second receiver electrodes and associated receiver circuits;
configuring the feedback circuit to only oscillate when a first capacitance between the transmitter electrode and the first activation receiver electrode reaches a threshold; and
processing signals received from the second receiver electrodes when the feedback circuit oscillates to determine a gesture.

15. The method of claim 14, further comprising a second capacitance between the first activation receiver electrode and the transmitter electrode.

16. The method of claim 15, wherein the second capacitance is controllable.

17. The method of claim 16, wherein the plurality of second receiver electrodes is arranged to detect gestures in a virtual keyboard.

18. The method of claim 14, further comprising a summation node receiving and summing output signals form the receiver circuits and feeding a summation signal into the driver circuit.

19. The method of claim 18, further comprising an envelope detector coupled with the first activation receiver electrode and the plurality of second receiver electrodes and said signal processing circuit.

20. The method of claim 14, further comprising a second activation receiver electrode, wherein the feedback circuit oscillates when the first capacitance reaches a threshold or when a third capacitance between the transmitter electrode and the second activation receiver electrode reaches another threshold.

21. The method of claim 14, further comprising a second activation receiver electrode, wherein the feedback circuit oscillates when both:
the first capacitance reaches a threshold; and
a third capacitance between the transmitter electrode and the second activation receiver electrode reaches another threshold.

22. The method of claim 21, wherein the first activation receiver electrode is placed at one edge of a space for detection, and the second activation receiver electrode is placed at an opposite edge of the space for detection.

23. The method of claim 22, wherein the first activation receiver electrode and the second activation receiver electrode are placed at edges of a space representing a space bar of a virtual keyboard.

24. The method of claim 14, wherein the plurality of second receiver electrodes is arranged in a linear manner to capture a multi-dimensional movement.

25. The method of claim 14, wherein the plurality of second receiver electrodes is arranged in a linear manner to capture a multi-dimensional movement adjacent to the circuit.

26. The method of claim 14, further comprising interpreting the gesture from amplitude or phase data from the plurality of second receiver electrodes and from frequency data from the first activation receiver electrode, wherein:
the first activation receiver electrode is adjacent to the transmitter electrode; and
the plurality of second receiver electrodes are arranged to define a space to be monitored.

* * * * *